United States Patent [19]

Heppenstall

[11] 4,449,162
[45] May 15, 1984

[54] DRIVE CIRCUIT

[75] Inventor: Keith Heppenstall, Greenford, England

[73] Assignee: Lucas Industries Limited, Birmingham, England

[21] Appl. No.: 318,267

[22] Filed: Nov. 4, 1981

[30] Foreign Application Priority Data

Dec. 9, 1980 [GB] United Kingdom ............... 8039419

[51] Int. Cl.³ ............................................ H01H 47/32
[52] U.S. Cl. .................................... 361/156; 361/4
[58] Field of Search ............... 361/155, 156, 152, 154, 361/210, 4, 3

[56] References Cited

U.S. PATENT DOCUMENTS 3,925,707  12/1975  Bhate et al. ........................... 361/3

FOREIGN PATENT DOCUMENTS 1244267  7/1967  Fed. Rep. of Germany .......... 361/3
2020503  11/1979  United Kingdom ................ 361/156

*Primary Examiner*—Reinhard J. Eisenzopf

[57] ABSTRACT

A drive circuit for an electromagnetic device includes an inductor which can be connected across a pair of supply lines by way of a first switch. Energy is stored in the core of the inductor which can be released into the device to cause rapid operation thereof by opening the first switch and closing a second switch. When the energy in the inductor has been dissipated a low level of current is allowed to flow into the device by way of the inductor from the supply lines and this flow of current can be maintained by means of a diode when the first switch is closed to re-energize the inductor.

4 Claims, 2 Drawing Figures

DRIVE CIRCUIT

This invention relates to a drive circuit for an electromagnetic device in particular an electromagnetic actuator.

In order to improve the response time of an electromagnetic device it is possible to energize the device from a high voltage electric supply. This has the effect of speeding the build-up of electric current in the winding of the device. The provision of the high voltage electric supply presents certain problems particularly if the available supply voltage is low for example, 12–24 volts. Moroever, the high voltage supply presents a safety hazard if it is of a permanent nature. Less of a safety hazard is present if the high voltage supply is generated only when it is required and the object of the present invention is to provide a drive circuit for an electromagnetic device in a simple and convenient form.

According to the invention a drive circuit for an electromagnetic device comprises first and second supply lines for connection to a low voltage DC supply, an inductor, first switch means operable to connect the inductor across the supply lines thereby to cause current flow through the inductor, and second switch means operable when said first switch means is opened to connect said device in a series circuit including said inductor whereby the energy stored in said inductor is utilized to initiate current flow in said device.

Figure 1:
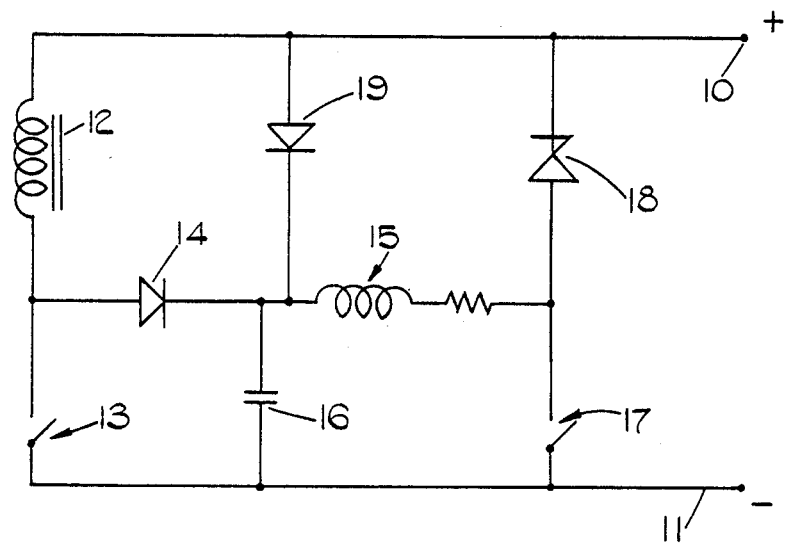
Figure 2:
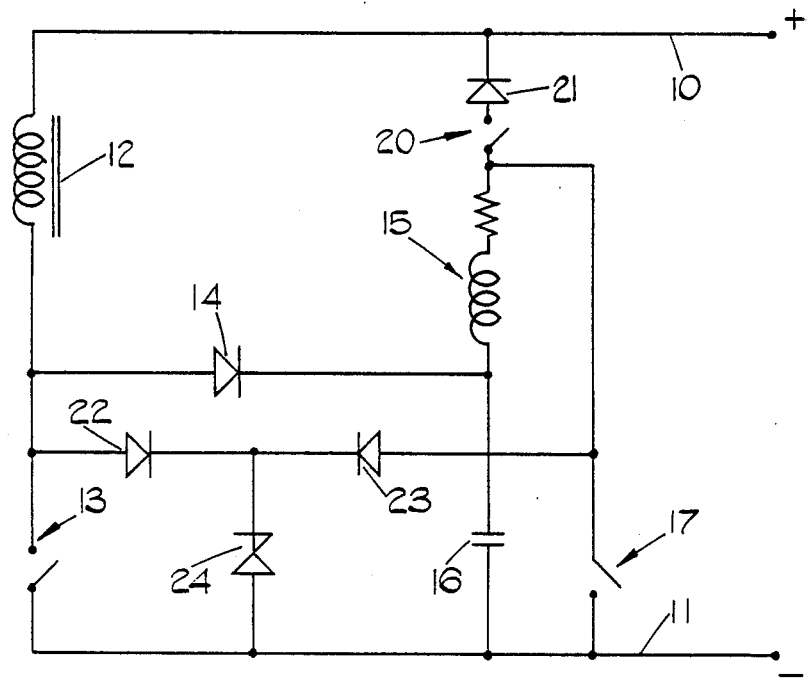

Examples of drive circuits in accordance with the invention will now be described with reference to the accompanying circuit diagrams, in which FIG. 1 shows one example of a drive circuit in accordance with the invention, and FIG. 2 shows a second example of a drive circuit in accordance with the invention.

Considering FIG. 1, the circuit comprises first and second supply lines 10, 11 for connection respectively to a low voltage DC supply for example, the storage battery of a vehicle. Also provided is an iron cored inductor 12 one terminal of which is connected to the supply line 10 and the other terminal of which can be connected to the supply line 11 by way of a first switch means indicated diagrammatically at 13. The aforesaid other terminal of the inductor is connected to the anode of a diode 14.

The cathode of the diode 14 is connected to one terminal of a capacitor 16 the other terminal of which is connected to the supply line 11, and also to one terminal of the electromagnetic device which is to be energized, this being indicated at 15. The other terminal of the device 15 can be connected by way of a second switch means 17 to the supply line 11. Moreover, the aforesaid other terminal of the device 15 is connected by way of a transient suppressor 18 to the supply line 10. Furthermore, the anode of the diode 14 is connected to the supply line 10 by way of a diode 19 having its anode connected to the supply line 10.

The operation of the circuit will now be described assuming that the switch means 13, and 17 are open and the supply lines are connected to the storage battery. In this situation the capacitor 16 is charged by way of the inductor 12 and the diode 14. The first stage in the operation of the circuit is the closure of the switch means 13 and this allows current flow to take place in the inductor 12, the current increasing in a substantially linear fashion with time. As a result of the current flow in the winding of the inductor, energy is stored in the core of the inductor and when it is judged that sufficient energy has been stored in the inductor the first switch means 13 is opened and the second switch means 17 is closed. The collapse of flux in the core of the inductor 12 induces a high voltage in the associated winding and this voltage is applied to the junction of the capacitor 16 and device 15 to raise the voltage at the junction. The capacitor acts as a buffer to ensure that the voltage at the junction does not rise to an unacceptable level. The resulting current flow through the device 15 takes place by way of the second switch means 17, the diode 21 and the accumulator. The rate of rise of current in the device 15 is high owing to the high voltage, and this leads to fast operation of the device. When substantially all the energy stored in the core of the inductor has been transferred, the current flow through the device 15 decreases to a lower value with the current able to flow by way of the winding of the inductor 12, and the diode 14. In practice most of the reduced current flow takes place by way of the diode 19. The device is therefore maintained in an energized state under reduced power which saves energy and also minimizes the heating of the winding of the device. The current flowing in the device 15 is determined by the internal resistance of the device.

In order to de-energize the device 15 the switch means 17 is opened and the energy stored in the winding of the device 15 is dissipated by way of the transient suppressor 18 and the capacitor 16. The cycle as described can be repeated however, if required the switch means 13 can be closed to recharge the inductor 12 before the switch 17 is opened to de-energize the device 15.

Referring now to FIG. 2 the components which have a similar function to those of FIG. 1 have the same reference numerals. In the circuit of FIG. 2 the second switch means includes a further switch 20 which is connected between the aforesaid other terminal of the device 15 and the anode of a diode 21 the cathode of which is connected to the supply line 10.

The circuit of FIG. 2 also includes a pair of diodes 22, 23 having their cathodes connected by way of a transient suppressor 24 to the supply line 11. The anode of the diode 22 is connected to the junction of the switch means 13 and the inductor 12 whilst the anode of the diode 23 is connected to the junction of the switch means 17 and the device 15.

The operation of the circuit will now be described assuming that the switch means 13, 17 and 20 are open and the supply lines are connected to the storage battery. In this situation the capacitor 16 is charged by way of the inductor 12 and the diode 14. The first stage in the operation of the circuit is the closure of the switch means 13 to allow current flow to take place in the inductor 12, the current increasing in a substantially linear fashion with time. As a result of the current flow in the winding of the inductor, energy is stored in the core of the inductor and when it is judged that sufficient energy has been stored in the core the first switch means 13 is opened and the second switch means 17 and 20 are closed. The collapse of flux in the core of the inductor 12 induces a high voltage in the associated winding and this voltage is applied to the junction of the capacitor 16 and device 15 to raise the voltage at the junction. The capacitor acts as a buffer to ensure that the voltage at the junction does no rise to an unacceptable level. The resulting current flow through the device 15 mostly takes place by way of the further switch 20 and the diode 21 although some current flow does occur through the switch means 17 and the accumulator. The rate of rise of current in the device 19 is high owing to the high voltage, and this leads to fast operation of the device. When substantially all the energy stored in the core of the inductor has been transferred, the current flow through the device 15 decreases to a lower value with the current flowing by way of the winding of the inductor 12, the diode 14, and the switch means 17 from the storage battery. The device is therefore maintained in an energized state under reduced power which saves energy and also minimizes the heating of the winding of the device.

In order to de-energize the device the switch means 17 and further switch 20 are opened and the energy stored in the winding of the device 15 is dissipated by way of the internal resistance of the device, the diode 23, the transient suppressor 24 and the capacitor 16. Moreover, any residual energy in the winding of the inductor is dissipated in the transient suppressor by way of the diode 22 and the storage battery. Thereafter the cycle is repeated as described.

The switch means in each example have of course been shown diagrammatically and solid state switches will be used in a practical circuit, the switches being controlled by a suitable timing circuit. In order to increase the speed of operation the iron core of the inductor may be replaced with a ferrite material.

I claim:

1. A drive circuit for an electromagnetic device comprising first and second supply lines for connection to a low voltage d.c. supply, an inductor, first switch means connected between one terminal of said inductor and one of said supply lines, the other terminal of the inductor being connected to the other of said supply lines, a first diode connected between the one terminal of the inductor and one terminal of said device, second switch means connected between the other terminal of the device and said one supply line, and a capacitor connected between said one terminal of the device and said one supply line, a transient suppressor connected between said other terminal of the device and said other supply line, said first switch means being closable to connect the inductor across the supply lines thereby to cause current flow through the inductor, said second switch means when said first switch means is opened, being closable to connect the device in a series circuit including said inductor whereby the energy sorted in said inductor is utilized to initiate current flow to said device.

2. A drive circuit according to claim 1 including a second diode connected between said one terminal of the device and said other supply line acting when the first and second switch means are closed to maintain current flow in the device from the supply lines.

3. A drive circuit according to claim 1 in which said second switch means includes a further switch connected between the other terminal of said device and said other supply line and a second diode connected in series with said further switch said second diode acting to conduct upon closure of said second switch means and said further switch.

4. A drive circuit according to claim 3 including a transient suppressor connected to said one supply line and by way of a pair of diodes respectively to the junctions of said first switch means and said inductor and said second switch means and said device.

* * * * *